(12) United States Patent
Hsieh

(10) Patent No.: US 8,889,513 B2
(45) Date of Patent: *Nov. 18, 2014

(54) TRENCH MOSFET WITH TRENCHED FLOATING GATES HAVING THICK TRENCH BOTTOM OXIDE AS TERMINATION

(71) Applicant: Fu-Yuan Hsieh, New Taipei (TW)

(72) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/953,026

(22) Filed: Jul. 29, 2013

(65) Prior Publication Data

US 2013/0330892 A1   Dec. 12, 2013

Related U.S. Application Data

(60) Division of application No. 13/171,965, filed on Jun. 29, 2011, now Pat. No. 8,525,255, which is a continuation-in-part of application No. 12/591,467, filed on Nov. 20, 2009, now Pat. No. 7,989,887.

(51) Int. Cl.
*H01L 21/336* (2006.01)
*H01L 29/66* (2006.01)
*H01L 27/115* (2006.01)

(52) U.S. Cl.
CPC .... *H01L 29/66621* (2013.01); *H01L 27/11521* (2013.01); *H01L 27/11531* (2013.01); *H01L 29/66825* (2013.01); *H01L 27/11519* (2013.01)
USPC ............ 438/270; 438/259; 257/330; 257/331

(58) Field of Classification Search
CPC ..................... H01L 29/66734; H01L 29/7827; H01L 29/66621
USPC ........................... 438/259, 270; 257/330–331
See application file for complete search history.

(56) References Cited

U.S. PATENT DOCUMENTS 6,049,104 A * 4/2000 Hshieh et al. ............... 257/328
8,035,159 B2 * 10/2011 Bhalla et al. ............... 257/330

* cited by examiner

*Primary Examiner* — Theresa T Doan
(74) *Attorney, Agent, or Firm* — Bacon & Thomas, PLLC

(57) ABSTRACT

A power semiconductor power device having composite trench bottom oxide and multiple trench floating gates is disclosed. The gate charge is reduced by forming a pad oxide surrounding a HDP oxide on trench bottom. The multiple trenched floating gates are applied in termination for saving body mask.

6 Claims, 20 Drawing Sheets

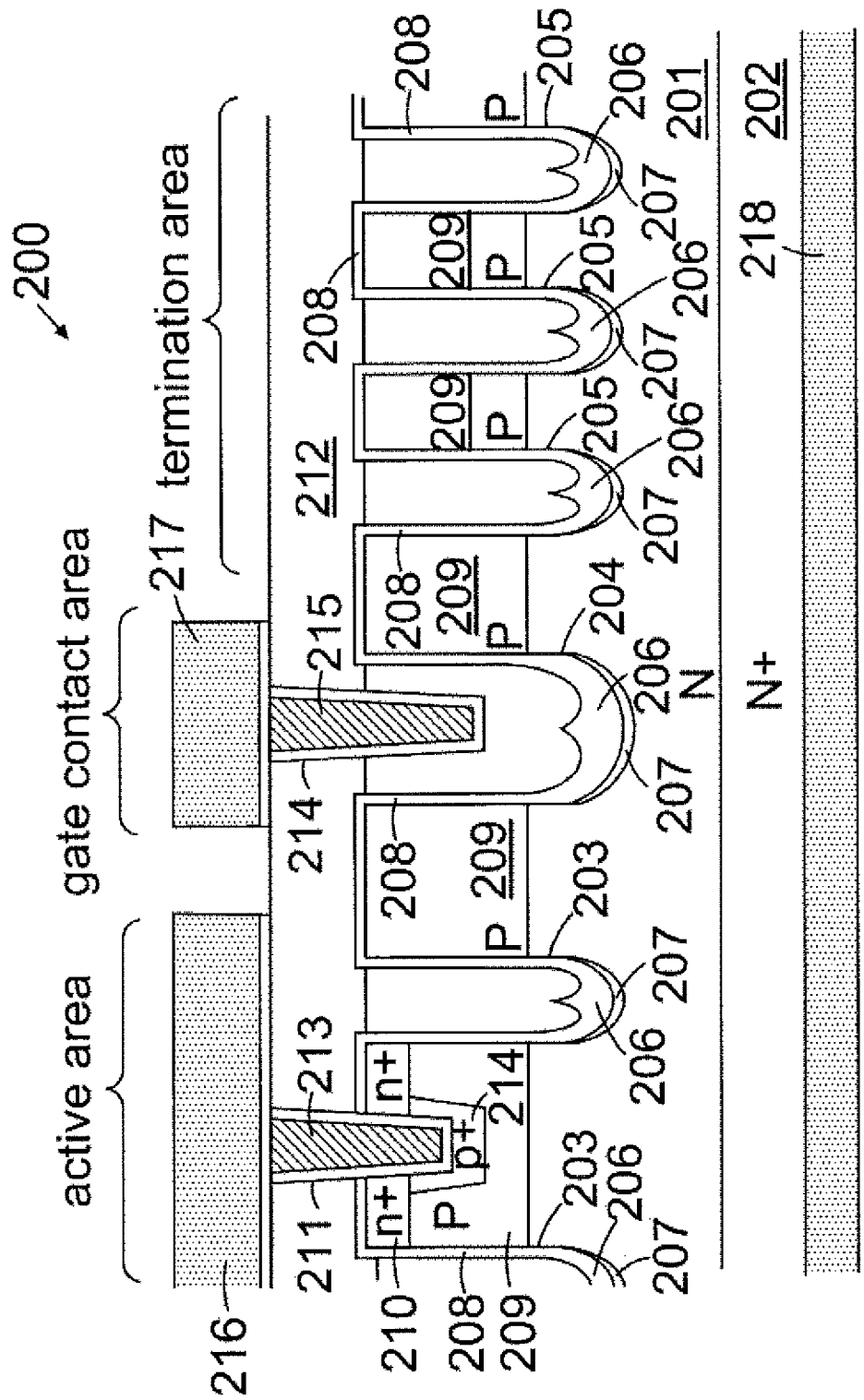

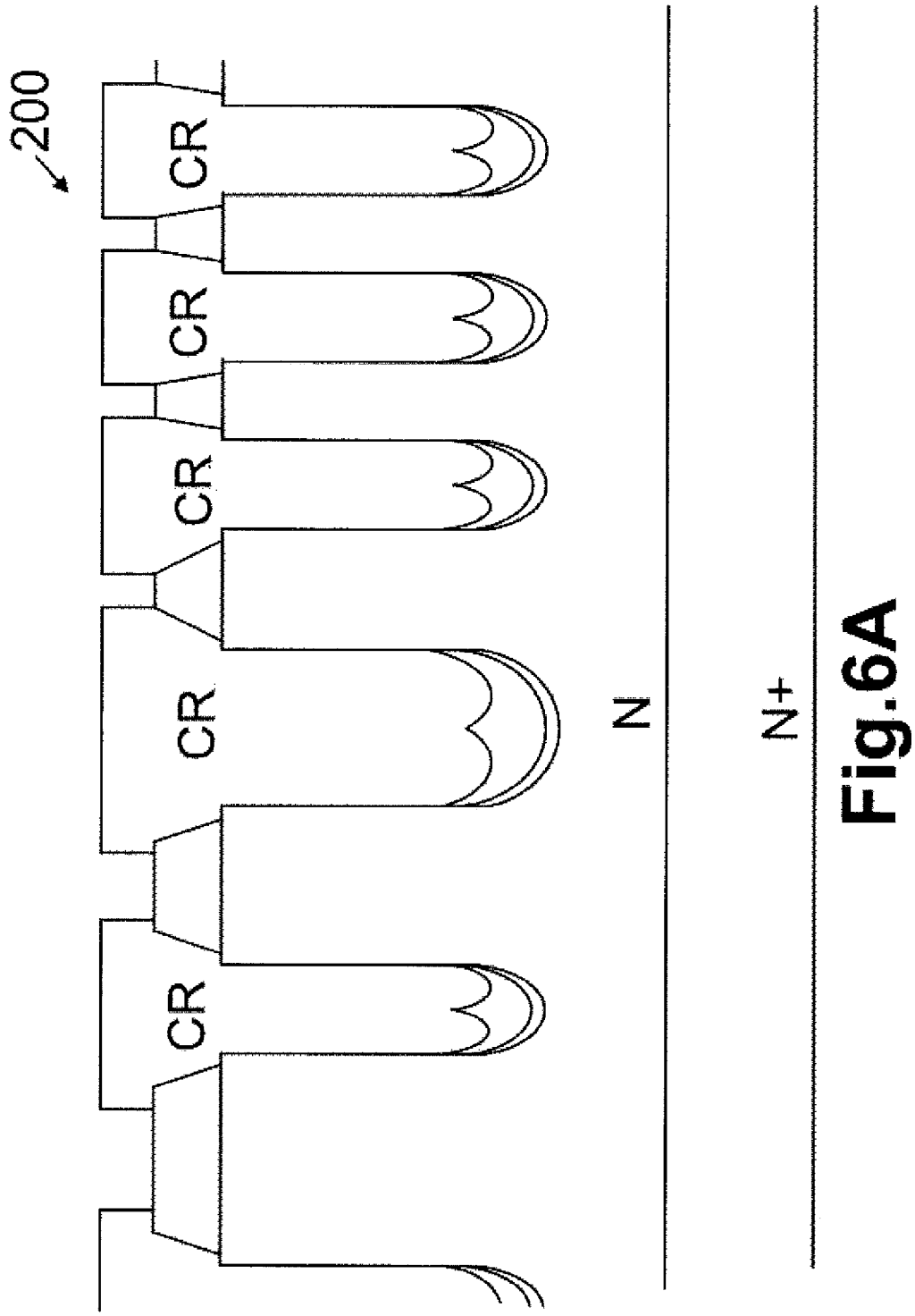

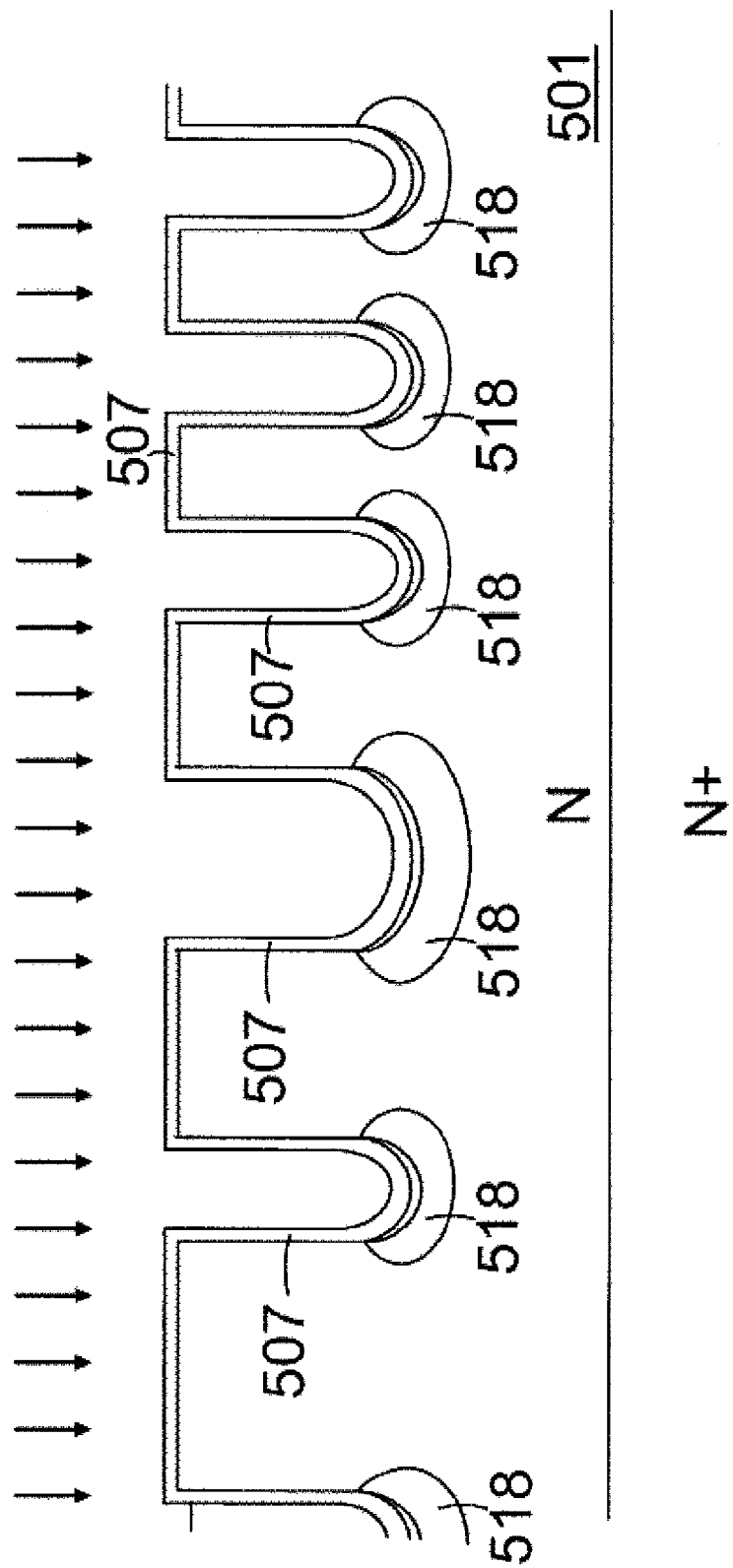

TRENCH MOSFET WITH TRENCHED FLOATING GATES HAVING THICK TRENCH BOTTOM OXIDE AS TERMINATION

This application is a divisional of U.S. patent application Ser. No. 13/171,965 filed on Jun. 29, 2011, which is a continuation in part of U.S. patent application Ser. No. 12/591,467 filed on Nov. 20, 2009, which is now U.S. Pat. No. 7,989,887, issued on Aug. 2, 2011, which is incorporated by reference.

FIELD OF THE INVENTION

This invention relates generally to the cell structure, device configuration and fabricating method of semiconductor power devices. More particularly, this invention relates to configuration and fabricating method of an improved trench MOSFET (Metal Oxide Semiconductor Field Effect Transistor) having thick trench bottom oxide and multiple trenched floating gates in termination area.

BACKGROUND OF THE INVENTION

In field of semiconductor power devices, it is desirable to further reduce Qgd (charge between gate and drain) for less power consumptions and higher switching speed, for a trench MOSFET (Metal Oxide Semiconductor Field Effect Transistor), such purposes are generally achieved by implementing a thick trench bottom oxide in trenched gates of the trench MOSFET. Meanwhile, it is also desirable to simplify the manufacturing processes in forming the trench MOSFET having thick trench bottom oxide mentioned above for requirement of mass-production.

FIG. 1 shows a trench MOSFET 100 of prior art having thick trench bottom oxide disclosed in U.S. Patent No. 20080265289 which has a high-density plasma (HDP, hereinafter) CVD oxide 115 on bottom of trenched gates for reduction of Qgd, and has a HDP oxide 120 on top surface of mesa area between adjacent trenched gates as implanting-ion block mask for saving body and source masks during manufacturing processes. However, the trench MOSFET 100 and the manufacturing method of prior art still encounter difficulties and limitations for device shrinkage and gate charge reduction. First, a high interface state gate charge is induced between the HDP oxide 115 and the bottom of the trenched gates. Second, planar source-body contact is used in the trench MOSFET 100 of prior art, limiting device cell shrinkage as the planar source-body contact occupying large space and causing poor contact performance. Furthermore, a trade-off between a space Sbs (the space defining P body and n+ source regions, as illustrated in FIG. 1) and thickness of the HDP oxide 115 causes a difficulty in optimization of device performance because the both are determined by wet etching time for removal of trenched gates sidewall oxide in manufacturing processes. The longer Sbs, the thinner the HDP 115 resulting in higher Qgd; the shorter Sbs, the less n+ source regions formed into the P body regions resulting in less contact area to source metal 160, leading to high contact resistance and poor contact performance.

Besides, the source metal 160 and gate metal 106 must keeps a space of at least 3.0 um to avoid metal bridging issue during metal etching process. In order to form an inverted V shape P body profile in middle of two adjacent trenched gates, the junction depth of the P body regions must be kept greater than 1.0 um along the trenched gates, causing high gate charge Qg. On the other hand, if the P body regions have shallow junction depth, the termination area (as illustrated in FIG. 1) will not work because the P body region in the termination area can not connect to the P body region in the active area (as illustrated in FIG. 1).

Meanwhile, near the trenched gate in gate contact area, which is positioned between the termination area and the active area, additional parasitic bipolar transistor with floating n+ source regions is built, causing poor avalanche capability because the parasitic bipolar transistor is easily turned on. Moreover, the termination area comprises guard rings having separated P body regions, which will result in early breakdown in middle of two adjacent trenched gates during the trench MOSFET 100 is reverse biased.

Accordingly, it would be desirable to provide a new and improved configuration and fabricating method for a semiconductor power device having low gate charge, high breakdown voltage and reduced cell pitch without complicating the process technology.

SUMMARY OF THE INVENTION

It is therefore an object of the present invention to provide a new and improved semiconductor power device such as a trench MOSFET with better performance than prior art by offering a semiconductor power device comprising: a plurality of first type trenched gates filled with conductive material padded by a gate insulating layer in active area, extending from top surface of a silicon layer of a first conductivity type, surrounded by source regions of the first conductivity type encompassed in body regions of a second conductivity type near the top surface; and the gate insulating layer comprising a composite bottom oxide on bottom of each first type trenched gates, comprising a thick bottom oxide and a pad oxide beneath, wherein the thick bottom oxide having greater thickness than sidewall oxide along sidewalls of each first type trenched gates. In some preferred embodiment, the thick oxide can be implemented by high density plasma (HDP) oxide. Therefore, the interface state gate charge between the trench bottom and the HDP oxide is reduced because of the inducing of the pad oxide.

It is another object of the present invention to further apply trenched source-body contact filled with metal plug between every adjacent of the first type trenched gates for achieving cell size shrinkage and eliminating the trade-off between the Sbs and the HDP oxide thickness discussed above. In some preferred embodiment, the trenched source-body contact can be implemented by forming vertical sidewalls or slope sidewalls penetrating through a contact insulating layer lying over the silicon layer, further through the source regions and extending into the body regions.

It is another object of the present invention to further apply at least a second type trenched gate in gate contact area, the second type trenched gate is filled with same conductive material padded with same gate insulating layer as the first type trenched gates in the active area. In some preferred embodiment, the second type trenched gate has greater trench width than the first type trenched gates in the active area.

It is another object of the present invention to further apply multiple of third type trenched gates as trenched floating gates in termination area having thick trench bottom oxide and body region extending between adjacent of said third type trenched gates to further enhance breakdown voltage.

It is another object of the present invention to further forming shallow body region without having the separated body region between the active area and the termination area in prior art.

It is another object of the present invention to further apply a manufacturing method with three masks process, therefore, no additional parasitic bipolar transistor is built in near the second type trenched gate in gate contact area, thus enhancing the avalanche capability.

It is another object of the present invention to implement the source region by having doping concentration along channel region near sidewalls of the first type trenched gates lower than that along the trenched source-body contact at same distance from the top surface of the silicon layer, and source junction depth along the channel region is shallower than that along the trenched source-body contract, and the doping profile of the source region along the top surface of the silicon layer has Gaussian-distribution from the trenched source-body contact to the channel region.

In some other preferred embodiment, the present invention can be implemented including one or more following features: the silicon layer is an epitaxial layer of the first conductivity type supported onto top surface of a substrate of the first conductivity type, wherein the epitaxial layer has lower doping concentration than the substrate; the thick bottom oxide in conjunction with the sidewall oxide forms a W shape interface with the conductive material; the thick bottom oxide in conjunction with the sidewall oxide forms a U shape interface with the conductive material; the semiconductor power device further comprising a trenched gate contact filled with the same metal plug as the trenched source-body contact, penetrating through the contact insulating layer and extending into the second type trenched gate; the metal plug is tungsten plug padded by a barrier layer of Ti/TiN or Co/TiN or Ta/TiN; the semiconductor power device further comprising an ohmic body contact region of the second conductivity type surrounding bottom and sidewalls of each trenched source-body contact in the body region, wherein the ohmic body contact region having higher doping concentration than the body region; the semiconductor power device further comprising a patterned source metal and a patterned gate metal onto the contact insulating layer, electrically contacting with the trenched source-body contact and the trenched gate contact, respectively; the third type trenched gates in the termination area have trench width greater than the first type trenched gates in the active area; the multiple of third type trenched gates comprises at least three third type trenched gates in the termination area as trenched floating gates; adjacent of the multiple of third type trenched gates in the termination area have equal space between one another; the semiconductor further comprising an on-resistance reduction doped region of the first conductivity type wrapping around bottom of each first, second and third type trenched gates for shallow trench, wherein the on-resistance reduction doped region connecting to the body regions and having a higher doping concentration than the silicon layer; the source regions are disposed only in the active area but not in the termination area and the gate contact area; the semiconductor power device further comprising a drain electrode disposed on a bottom surface of the substrate supporting the epitaxial layer on a top surface of the substrate.

This invention further disclosed a method of manufacturing a power semiconductor power device comprising the steps of: (a) forming a plurality of gate trenches in an epitaxial layer of a first conductivity type; (b) depositing a HDP oxide on trench sidewall, and trench bottom, and top surface of mesa area between every two adjacent of the gate trenches, wherein the trench sidewall has thinner oxide than the trench bottom and the mesa area; (c) using wet etching to remove the oxide on the trench sidewall completely, and to remove the oxide on the trench bottom and the mesa area partially, wherein a remaining oxide on the trench bottom defined as trench bottom oxide; (d) depositing a photo resist filled into the gate trenches and top surface of the mesa area; (e) removing a portion of the photo resist from the top surface of the mesa area to expose the top surface where the HDP oxide can be removed; (f) removing the HDP oxide from the top surface of the mesa area completely; (g) forming a gate oxide on trench sidewall; and (h) forming trenched gates, trenched floating gates, body regions, source regions and trenched source-body contact in the epitaxial layer. In some preferred embodiment, the step (b) further comprising forming a pad oxide on said trench sidewall and said trench bottom, and top surface of said mesa area before depositing said HDP oxide. In some preferred embodiment, the step (e) is performed by blankly exposing said photo resist without having an additional mask. In some preferred embodiment, the step (e) is performed by blankly dry ashing said photo resist without having an additional mask. In some preferred embodiment, the step (e) is performed by exposing photo resist with an additional oversized mask protecting said photo resist on top of said gate trenches. In some preferred embodiment, the step (i) further comprising: applying a contact mask and dry oxide etching to remove a contact insulating layer overlying said semiconductor device from contact openings; implanting said body region with a dopant of said first conductivity type through said contact openings and diffusing it to form said source regions; and forming trenched source-body contact extending into body region by dry silicon etching through said contact openings.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 2A is a cross-sectional view of a preferred embodiment according to the present invention.

FIG. 8 is a cross-sectional view for showing one of the processing steps for fabricating the trench MOSFET as shown in FIGS. 3A and 3B.

DETAILED DESCRIPTION OF THE EMBODIMENTS

Figure 1:
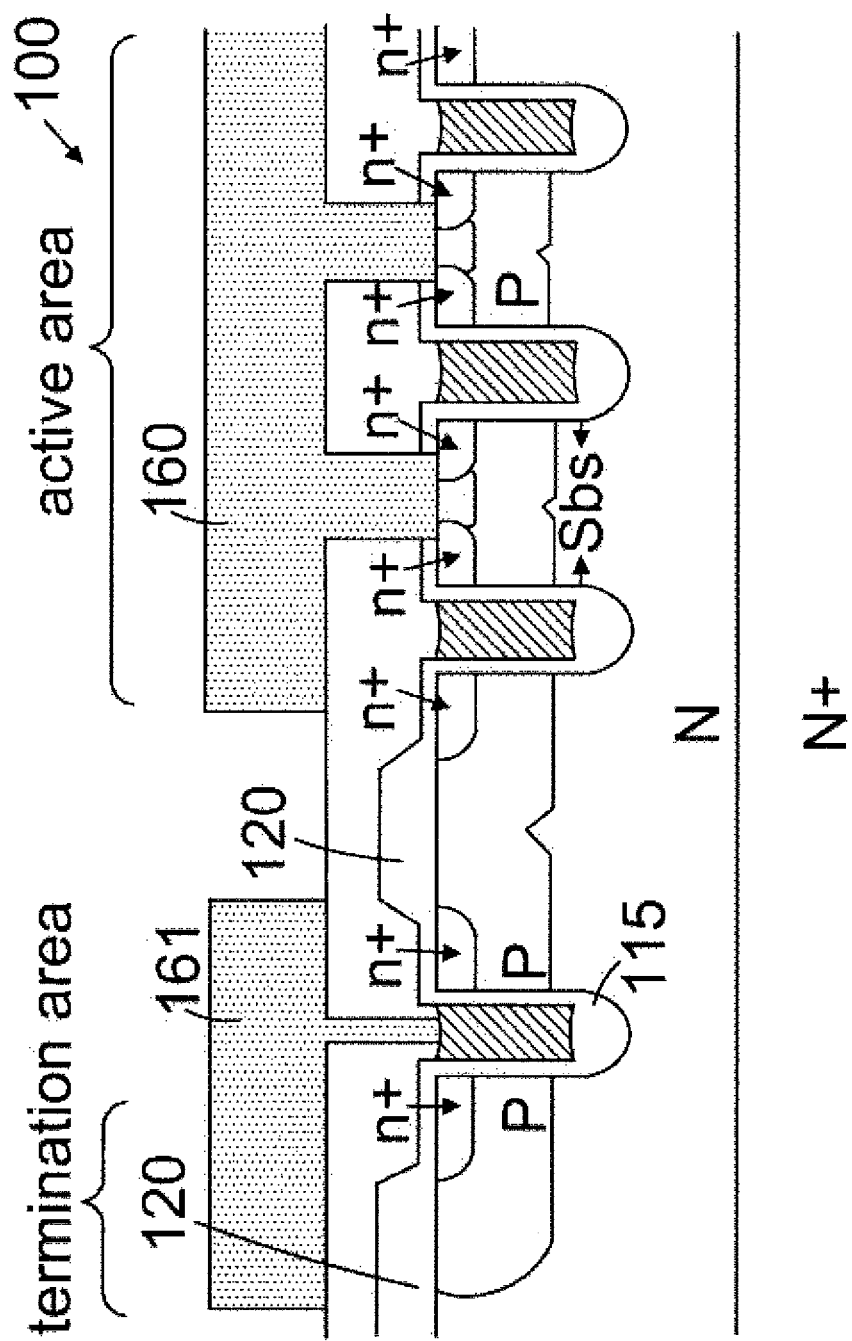
FIG. 1 is a cross-sectional view of a trench MOSFET of prior art.

Please refer to FIG. 2A for a preferred N-channel trench MOSFET 220 with composite oxide as trench bottom oxide for reduced gate charge according to the present invention. The N-channel trench MOSFET 200 is formed in an N epitaxial layer 201 supported on a heavily doped N+ substrate 202 which coated with back metal 218 on the rear side as drain electrode, in some preferred embodiment, the N+ substrate 202 can be implemented by using a red phosphorus substrate. A plurality of trenched gates are formed extending from top surface of the N epitaxial layer 201, among those trenched gates, including: a plurality of first type trenched gates 203 in active area, at least one second type trenched gate 204 in gate contact area and multiple of third type trenched gates 205 in termination area. Some preferred embodiment includes following features: the second type trenched gates 204 has greater trench width than the first type trenched gates 203; the third type trenched gates 205 have greater trench width than the first type trenched gates 203. Those first, second and third type trenched gates are all formed in same manufacturing processes and filled with doped poly-silicon layer onto a composite trench bottom oxide, wherein the composite trench bottom oxide: a HDP oxide layer 206 on bottom of those trenched gates; a pad oxide layer 207 underneath and surrounding the HDP oxide layer 206; and a gate oxide layer 208 onto the HDP oxide layer 206, wherein the gate oxide layer 208 is also lining sidewalls of those first, second and third type trenched gates as sidewall oxide. As illustrated in FIG. 2A, the composite trench bottom oxide in conjunction with the sidewall oxide forms a W shape interface with the doped poly-silicon layer filled in those trenched gates. P body regions 209 are extending between two adjacent of those first, second and third type trenched gates while encompassing n+ source region 210 neat top surface only in the active area. A trenched source-body contact 211 having slope sidewalls is penetrating through a contact insulating layer 212 lying over the trench MOSFET 200, and further penetrating through the n+ source region 210 and extending into the P body region 209 between every two adjacent of the first type trenched gates 203 in the active area, according to FIG. 2A, the trenched source-body contact is implemented by having slope sidewalls and filled with tungsten plug 213 padded by a barrier layer of Ti/TiN or Co/TiN or Ta/TiN. The n+ source region 210 has doping concentration along channel region near sidewalls of the first type trenched gates 203 same as along the trenched source-body contact 211 at same distance from the top surface of the N epitaxial layer 201, and junction depth of the n+ source region 210 is same as along the channel region as along the trenched source-body contact 211. Underneath the trenched source-body contact 211, a p+ ohmic body contact region 214 is formed surrounding bottom and sidewalls of the trenched source-body contact 211 within the P body region 209 to further reduce the contact resistance between the tungsten metal plug 213 and the P body region 209, wherein the p+ ohmic body contact region 214 has a higher doping concentration than the P body region 209. In the gate contact area, a trenched gate contact 214 formed at same manufacturing processes as the trenched source-body contact 211 is penetrating through the contact insulating layer 212 and extending into the doped poly-silicon layer within the second type trenched gate 206, the trenched gate contact 214 is also having slope sidewalls and filled with tungsten metal plug 215 padded by the barrier layer of Ti/TiN or Co/TiN or Ta/TiN. Onto the contact insulating layer 212, a patterned source metal 216 and a patterned gate metal 217 padded by a resistance-reduction layer of Ti or Ti/TiN is formed to be electrically contacting with the tungsten metal plug 213 filled in the trenched source-body contact 211, and the tungsten metal plug 215 filled in the trenched gate contact 214, respectively, wherein the source metal 216 and the gate metal 217 can be implemented by Al alloys or Cu layer or Ni/Ag or Ni/Au or composing of a Ni/Au or Ni/Ag over a Al alloys layer. In termination area, the multiple of third type trenched gates 205 with floating voltage forms trenched floating gates with P body regions 209 extending there between to further enhance breakdown voltage of the trench MOSFET 200.

Figure 2B:
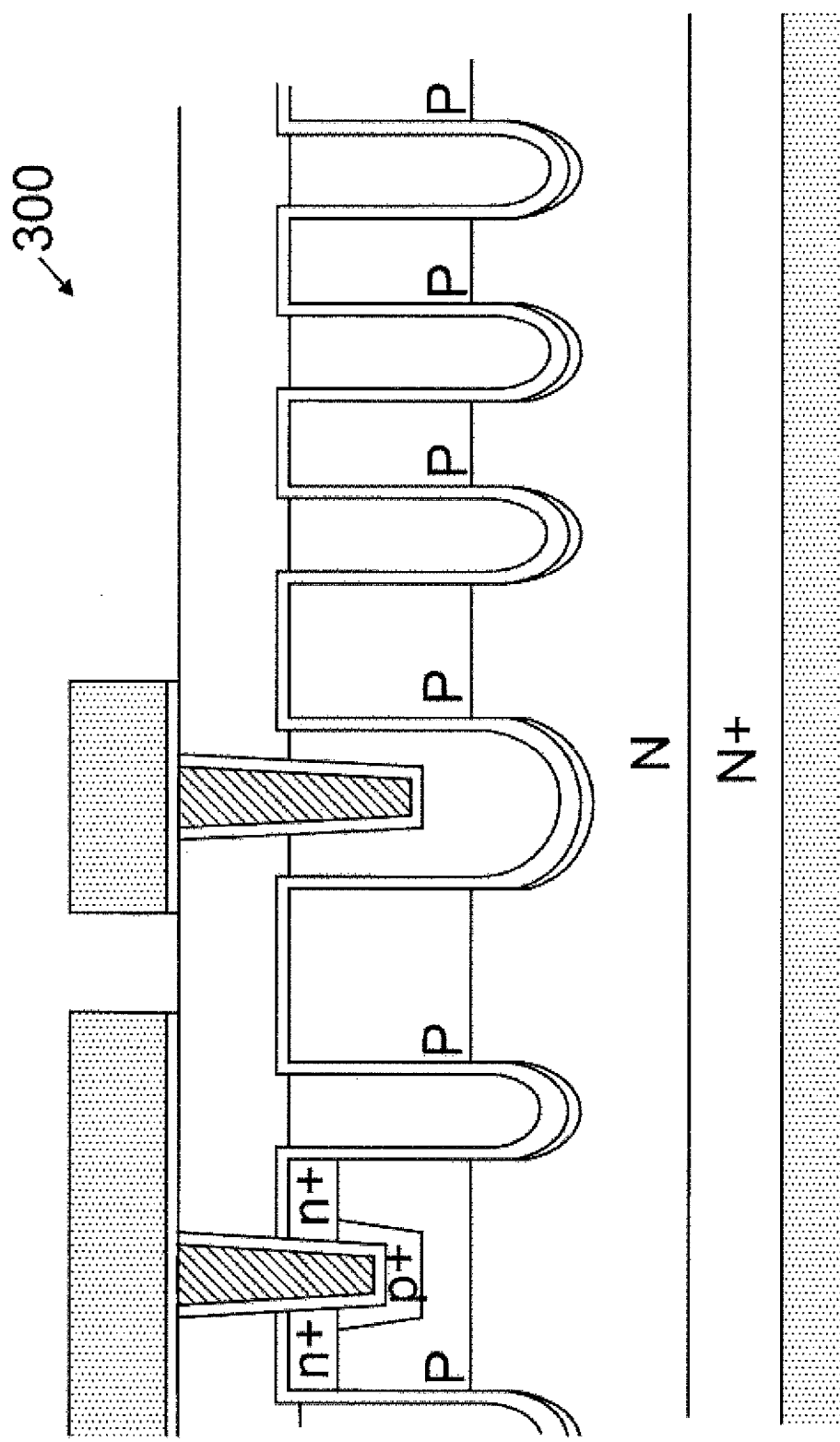
FIG. 2B is a cross-sectional view of another preferred embodiment according to the present invention.

Please refer to FIG. 2B for another preferred N-channel trench MOSFET 300 with composite trench bottom oxide for reduction of gate charge according to the present invention. The N-channel trench MOSFET 300 has a similar configuration to the N-channel trench MOSFET 200 in FIG. 2A, except that, the composite trench bottom oxide in conjunction with the sidewall oxide forms a U shape interface with the doped poly-silicon layer filled in the trenched gates.

Figure 3A:
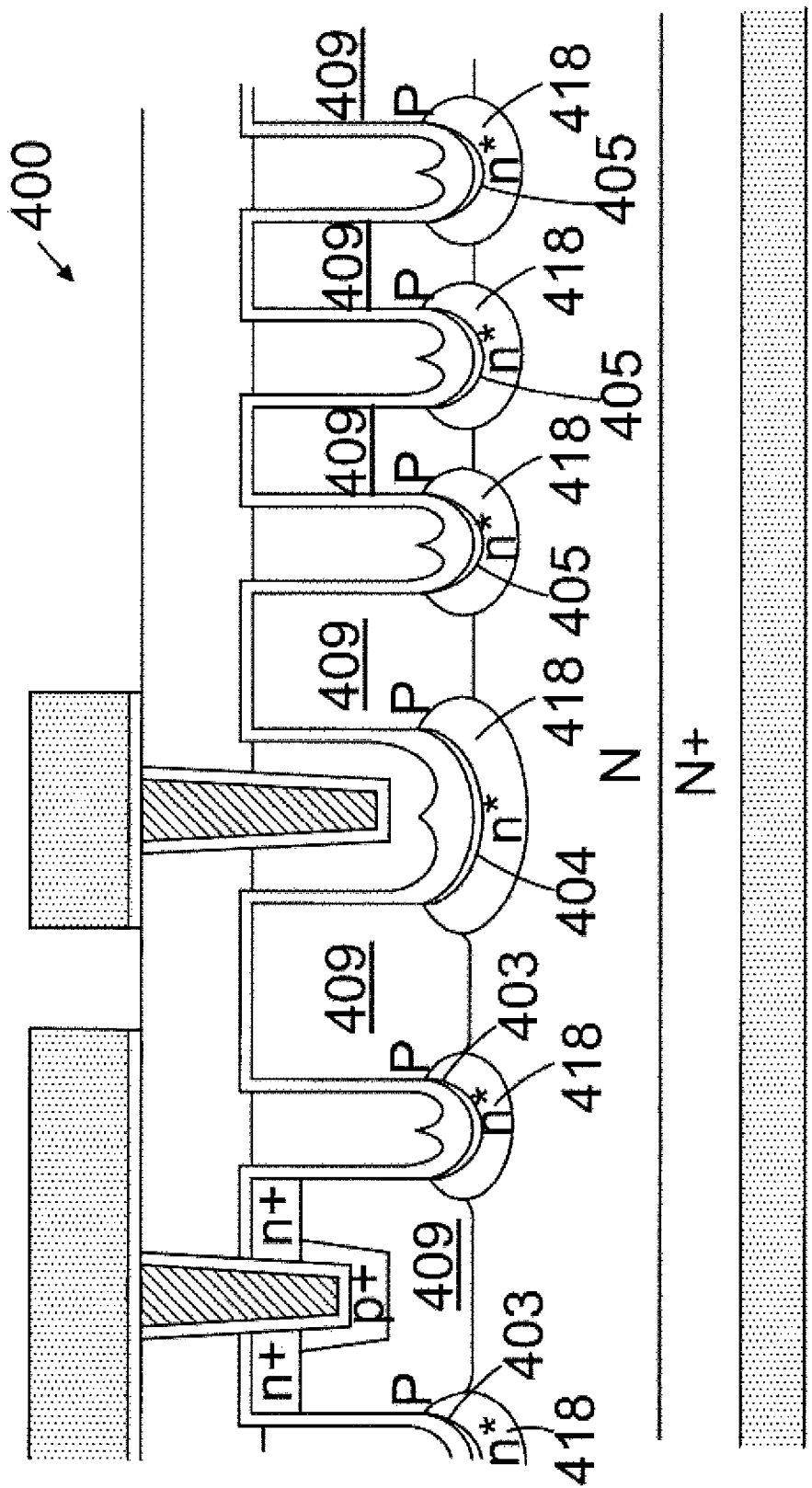
FIG. 3A is a cross-sectional view of another preferred embodiment according to the present invention.

Please refer to FIG. 3A for another preferred N-channel trench MOSFET 400 with composite trench bottom oxide for reduction of gate charge according to the present invention. The N-channel trench MOSFET 400 has a similar configuration to the N-channel trench MOSFET 200 in FIG. 2A, except that, there is an n* on-resistance reduction doped region 418 underneath each first, second and third type trenched gates. The n* on-resistance reduction doped region 418 wraps bottom of each first type trenched gates 403, second type trenched gate 404 and third type trenched gates 405 while connecting to the P body regions 409 to further reduce on-resistance of the N-channel trench MOSFET 400.

Figure 3B:
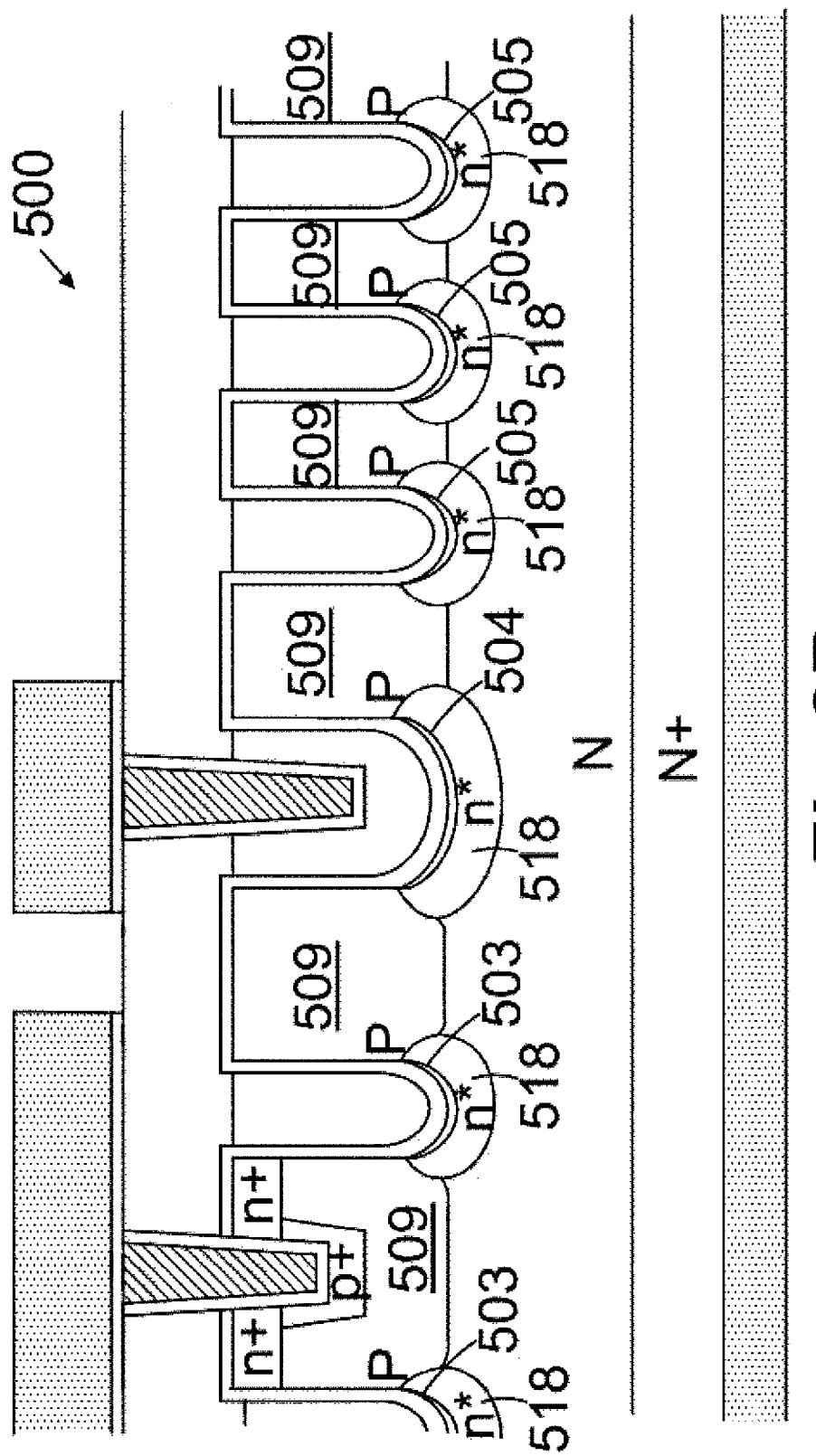
FIG. 3B is a cross-sectional view of another preferred embodiment according to the present invention.

Please refer to FIG. 3B for anther preferred N-channel trench MOSFET 500 with composite trench bottom oxide for reduction of gate charge according to the present invention. The N-channel trench MOSFET 500 has a similar configuration to the N-channel trench MOSFET 300 in FIG. 2B, except that, there is an n* on-resistance reduction doped region 518 underneath each first, second and third type trenched gates. The n* on-resistance reduction doped region 518 wraps bottom of each first type trenched gates 503, second type trenched gate 504 and third type trenched gates 505 while connecting to the P body regions 509 to further reduce on-resistance of the N-channel trench MOSFET 500.

Figure 4:
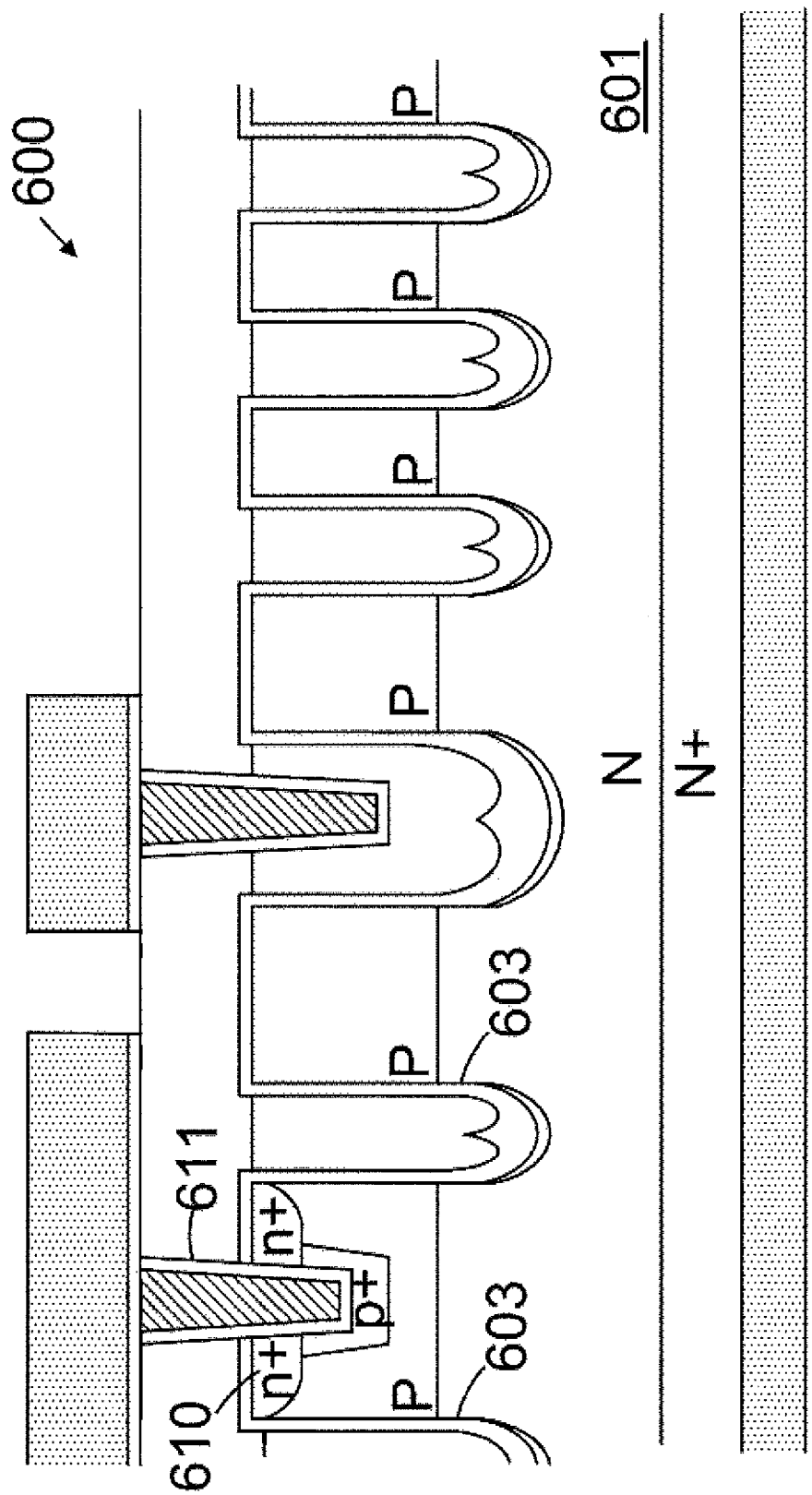
FIG. 4 is a cross-sectional view of another preferred embodiment according to the present invention.

Please refer to FIG. 4 for anther preferred N-channel trench MOSFET 600 with composite trench bottom oxide for reduction of gate charge according to the present invention. The N-channel trench MOSFET 600 has a similar configuration to the N-channel trench MOSFET 200 in FIG. 2A, except that, the n+ source region 610 has doping concentration along channel region near the first type trenched gates 603 lower than along the trenched source-body contact 611 at same distance from top surface of the N epitaxial layer 601, and junction depth of the n+ source region 610 is shallower along the channel region than along the trenched source-body contact 611, and the doping profile of the n+ source region 610 along the top surface of the N epitaxial layer 601 has Gaussian-distribution from the trenched source-body contact 611 to the channel region.

Figure 5A:
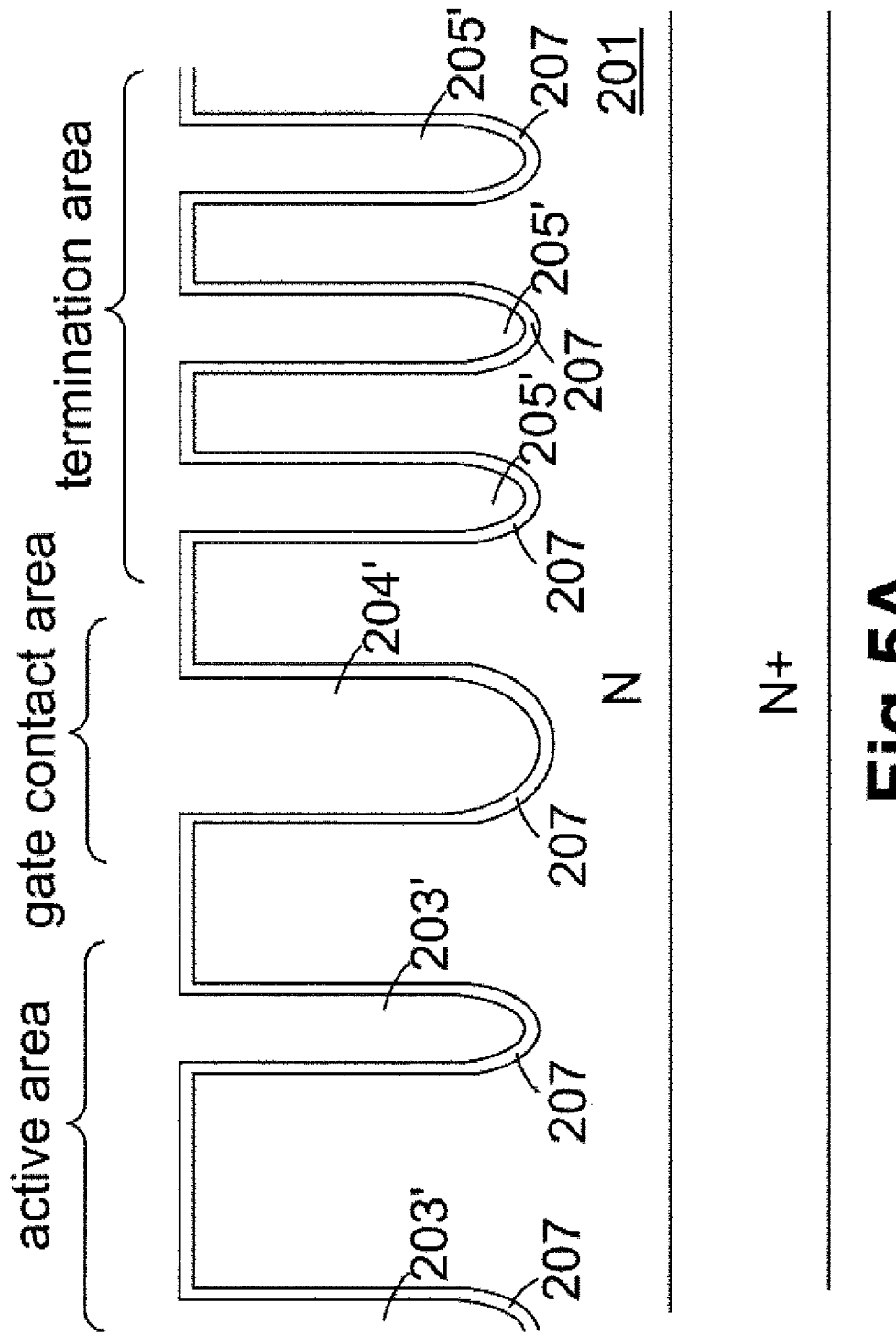
FIGS. 5A-5I are a serial of side cross-sectional views for showing the processing steps for fabricating the trench MOSFET as shown in FIG. 2A, FIGS. 6A-6B are a serial of side cross-sectional views for showing another method for fabricating the trench MOSFET as shown in FIG. 2A.

FIGS. 5A to 5I are a serial of exemplary steps that are performed to form the preferred N-channel trench MOSFET 200 in FIG. 2A by using 4 masks. In FIG. 5A, an N epitaxial layer 201 is grown on an N+ substrate 202, for example, a red phosphorus substrate. Then, after applying a trench mask (not shown) onto the N epitaxial layer 201, a step of silicon etching is performed to form a plurality of gate trenches extending from top surface of the N epitaxial layer 201, including: a plurality of first type gate trenches 203' in the active area, at least a second type gate trench 204' in the gate contact area and multiple of third type gate trenches 205' in the termination area, among those gate trenches, the second type gate trench 204' in the gate contact area has a trench width greater than the first type gate trenches 203' in the active area, each the third type gate trench 205' in the termination area has a trench width greater than the first type gate trenches 203' in the active area. After that, a sacrificial oxide layer (not shown) is applied and then removed to eliminate the plasma damage introduced while etching those gate trenches. Then, a pad oxide layer 207 is formed along sidewalls and bottoms of those first, second and third type gate trenches and lining the top surface of the N epitaxial layer 201.

Figure 5B:
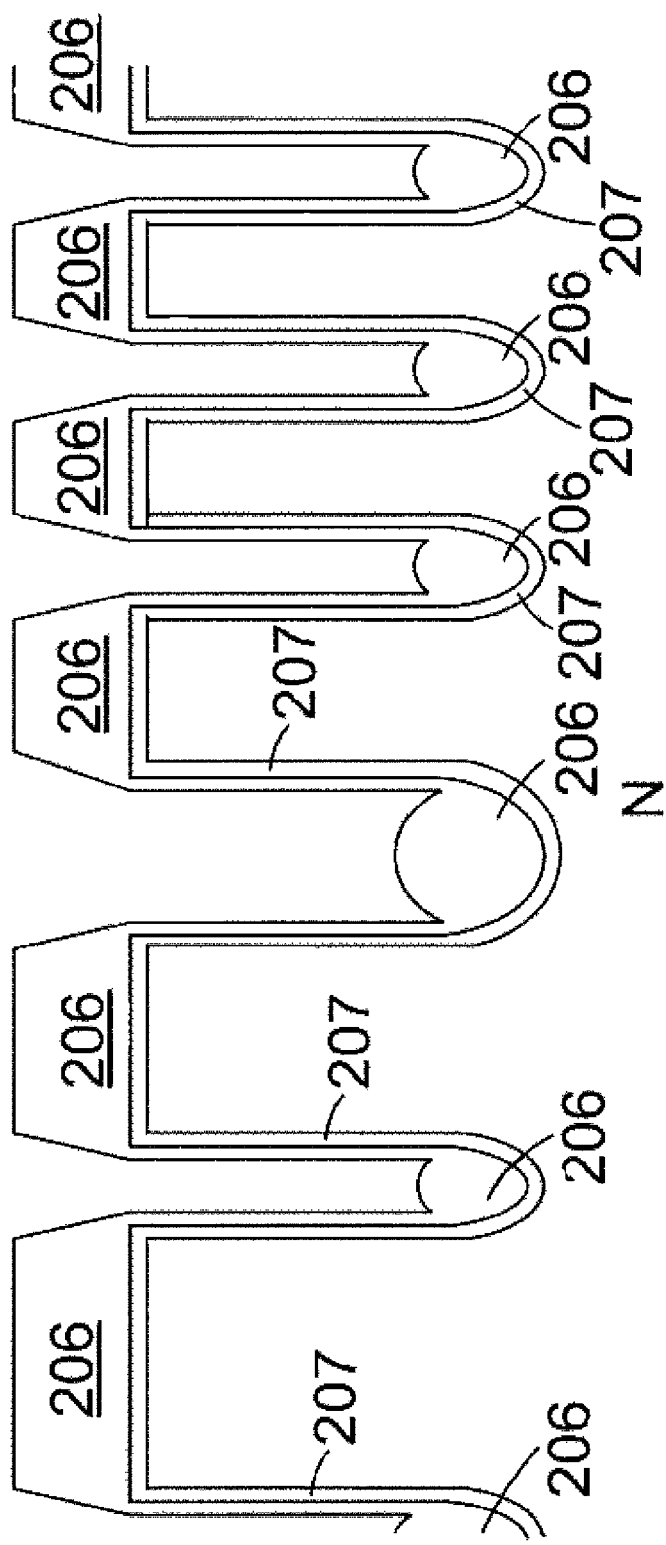
Figure 5C:
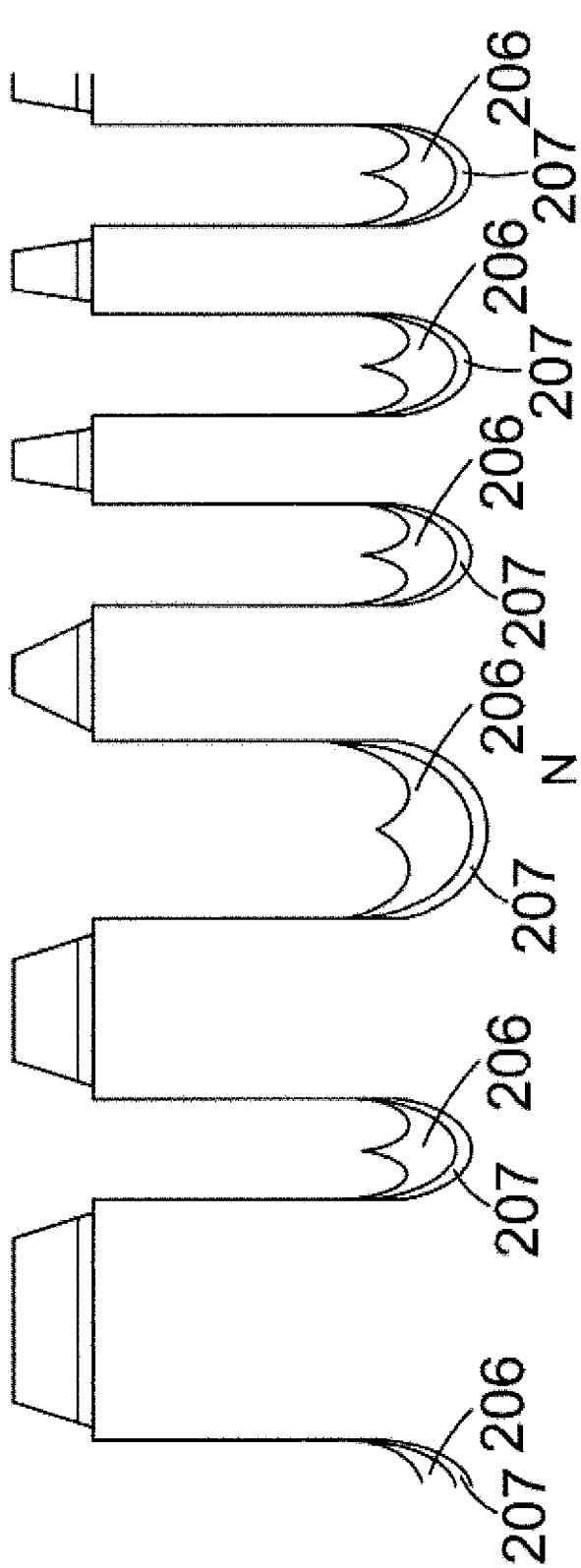

In FIG. 5B, a HDP oxide 206 is deposited onto the pad oxide layer 207. In FIG. 5C, a wet oxide etching is carried out to remove the oxide layer on trench sidewalls of those first, second and third type gate trenches, including the portion of the pad oxide 206 and the HDP oxide 207 on trench sidewalls.

Figure 5D:
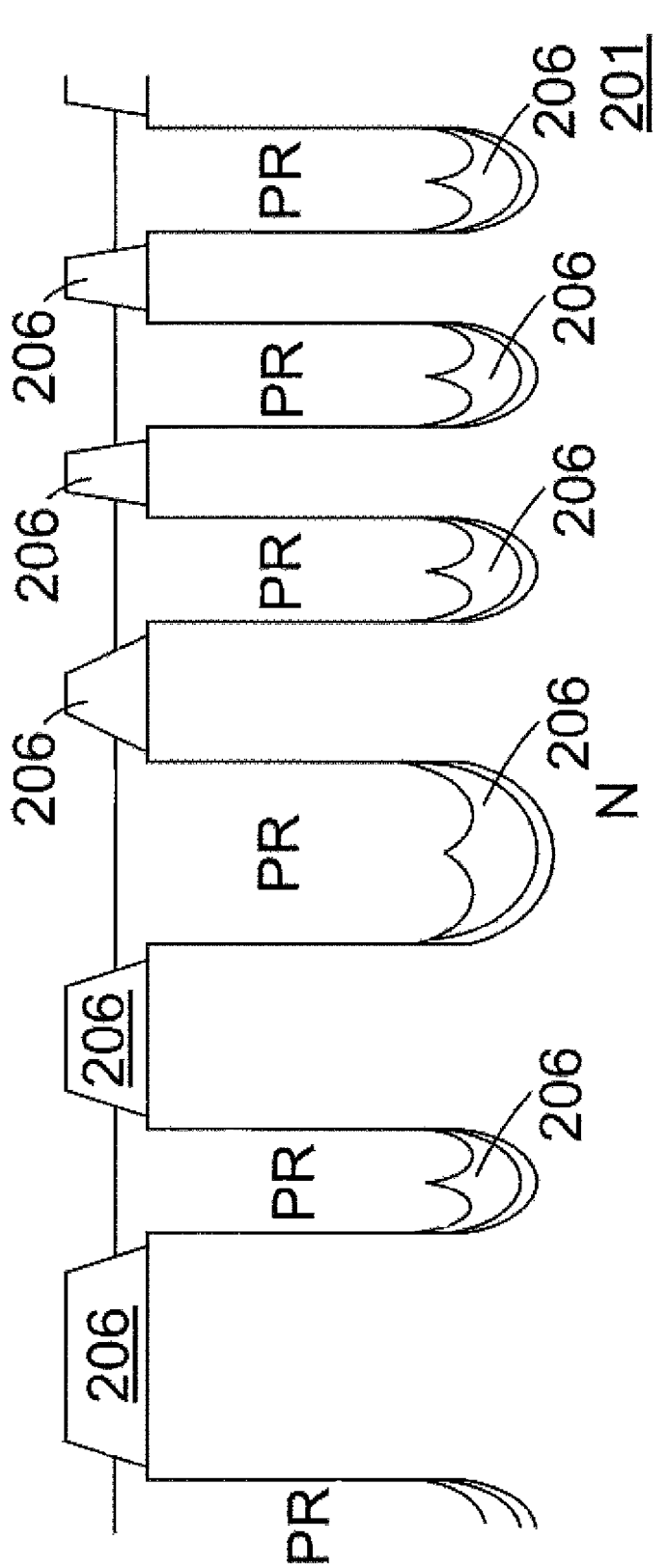

In FIG. 5D, a layer of photo resist (PR, as illustrated in FIG. 5D) is applied filling into those first, second and third type gate trenches and covering the N epitaxial layer 201. Then, a step of blank exposure or plasma ashing is carried out to expose the portion of the HDP oxide 206 on mesa area between two adjacent of those gate trenches. Or the photo resist is exposed with an additional oversized mask protecting the photo resist on top of those gate trenches.

Figure 5E:
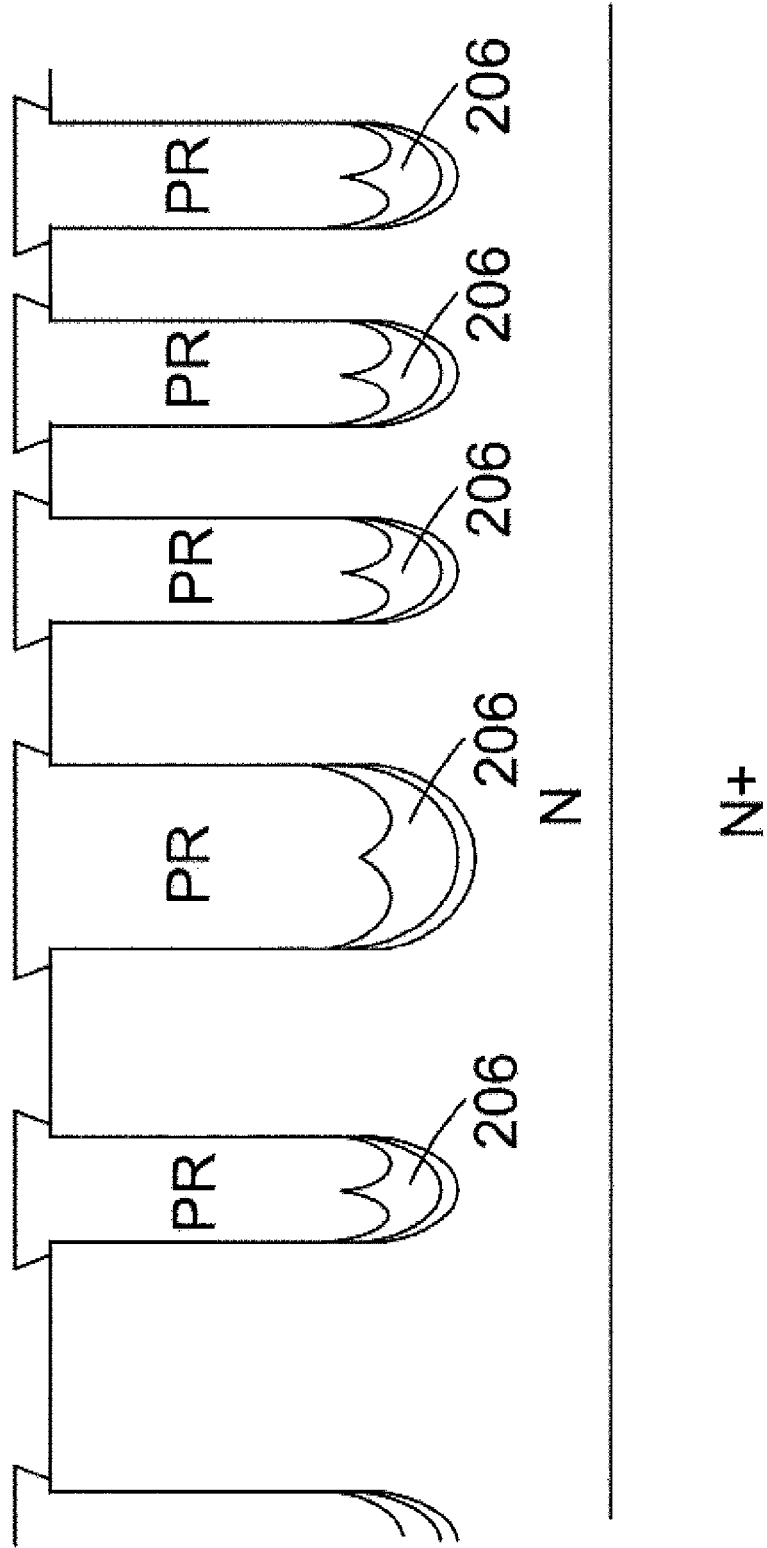
Figure 5F:
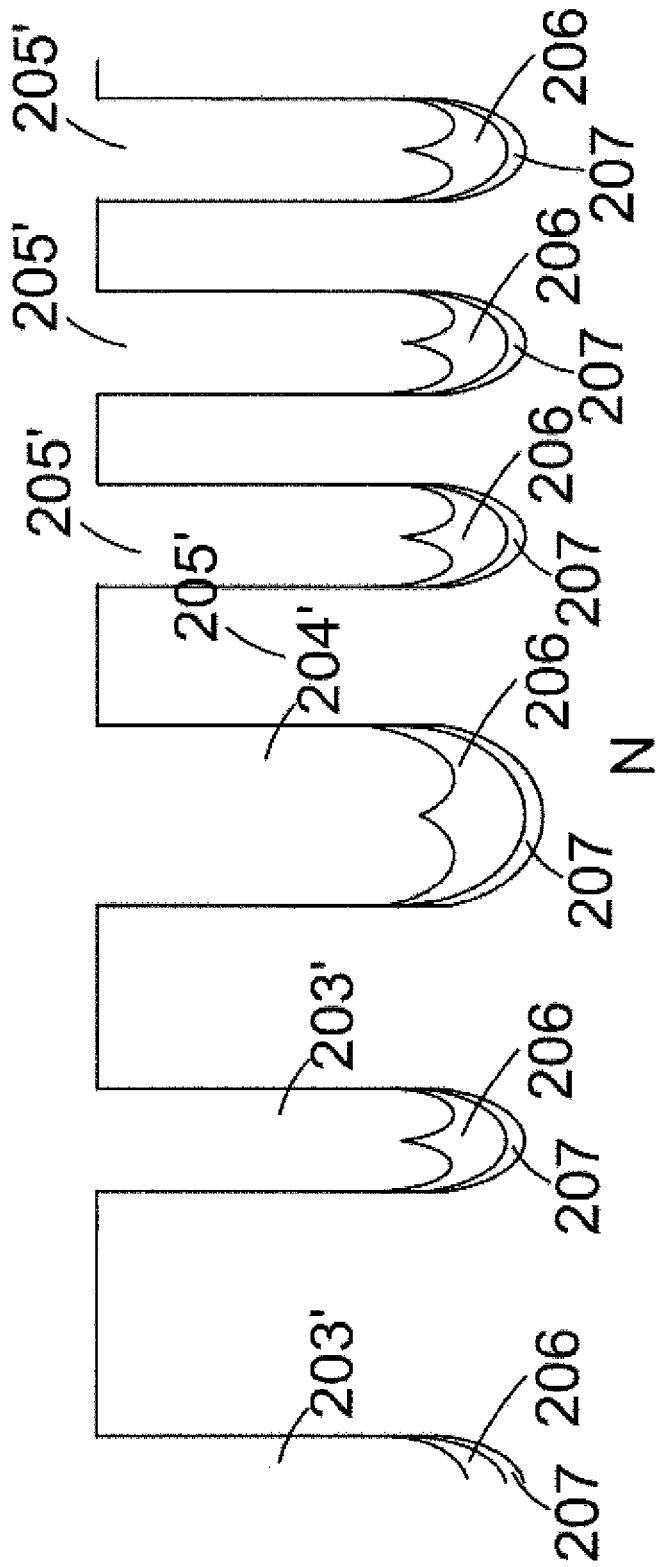

In FIG. 5E, a step of wet oxide etching is carried out to remove the portion of the HDP oxide layer 206 on the mesa area. In FIG. 5F, after the photo resist is removed away, the pad oxide layer 207 and the HDP oxide 206 is kept only onto trench bottom of the first type gate trenches 203', the second type gate trench 204' and the third type gate trenches 205'.

Figure 5G:
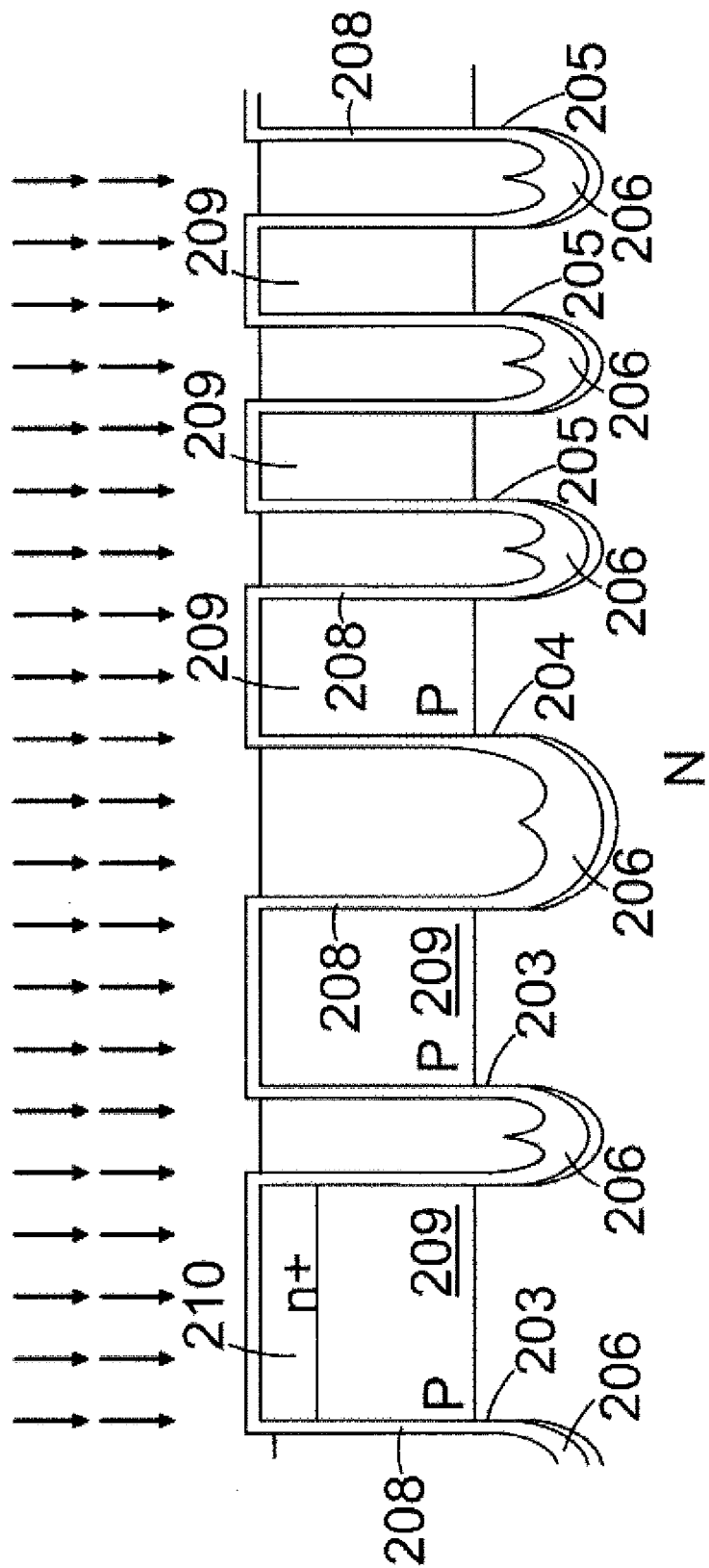

In FIG. 5G, a gate oxide layer 208 is grown or deposited onto the HDP oxide 206 and along trench sidewalls of those first, second and third type gate trenches and lining over the mesa area between two adjacnet of those gate trenches, then, a doped poly-silicon layer is deposited onto the gate oxide layer 208. After that, a dry etching or CMP (Chemical Mechanical Polishing) step is carried out to remove portion of the doped poly-silicon layer away from the mesa area and to be kept only within those gate trenches to form a plurality of first type trenched gates 203, at least a second type trenched gate 204 and multiple of third type trenched gates 205. As illustrated, the HDP oxide 206 in conjunction with the gate oxide layer 208 forms a W shape interface with the doped poly-silicon in those trenched gates. Then, a body ion implantation and a body diffusion steps are successively carried out without a body mask to form a plurality of P body regions 209 extending between every two adjacent of the first type trenched gates 203, the second type trenched gate 204 and the third type trenched gates 205. Next, after applying a source mask (not shown), a source ion implantation and a source diffusion steps are successively carried out to form n+ source region 210 only between two adjacent of the first type trenched gates 203 only within the active area.

Figure 5H:
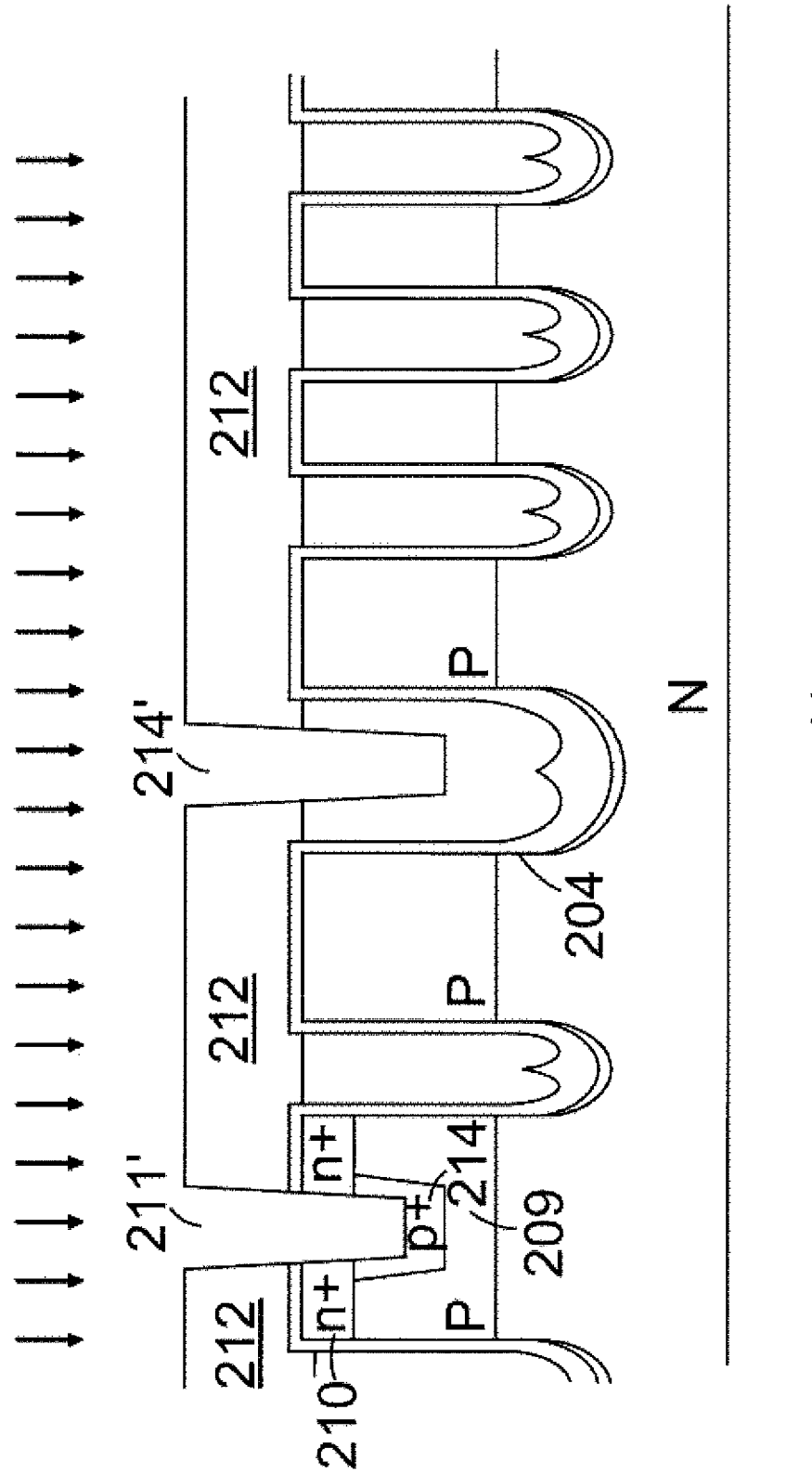

In FIG. 5H, a contact insulating layer 212 is deposited covering top surface of the trench MOSFET. Then, after applying a contact mask (not shown), steps of oxide etching and silicon etching are successively carried out to form a source-body contact opening 211' in the active area, and to form a gate contact opening 214' in the gate contact area, wherein the source-body contact opening 211' having slope sidewalls is penetrating through the contact insulating layer 212, the n+ source region 210 and extending into the P body region 209, the gate contact opening 214' having slope sidewalls is penetrating through the contact insulating layer 212 and further extending into the second type trenched gates 204. Next, a p+ ion implantation step is performed to form an p+ ohmic body contact region 214 within the P body region 209 while wrapping aroudn bottom and sidewalls of the source-body contact opening 211' underneath the n+ source region 210.

Figure 5I:
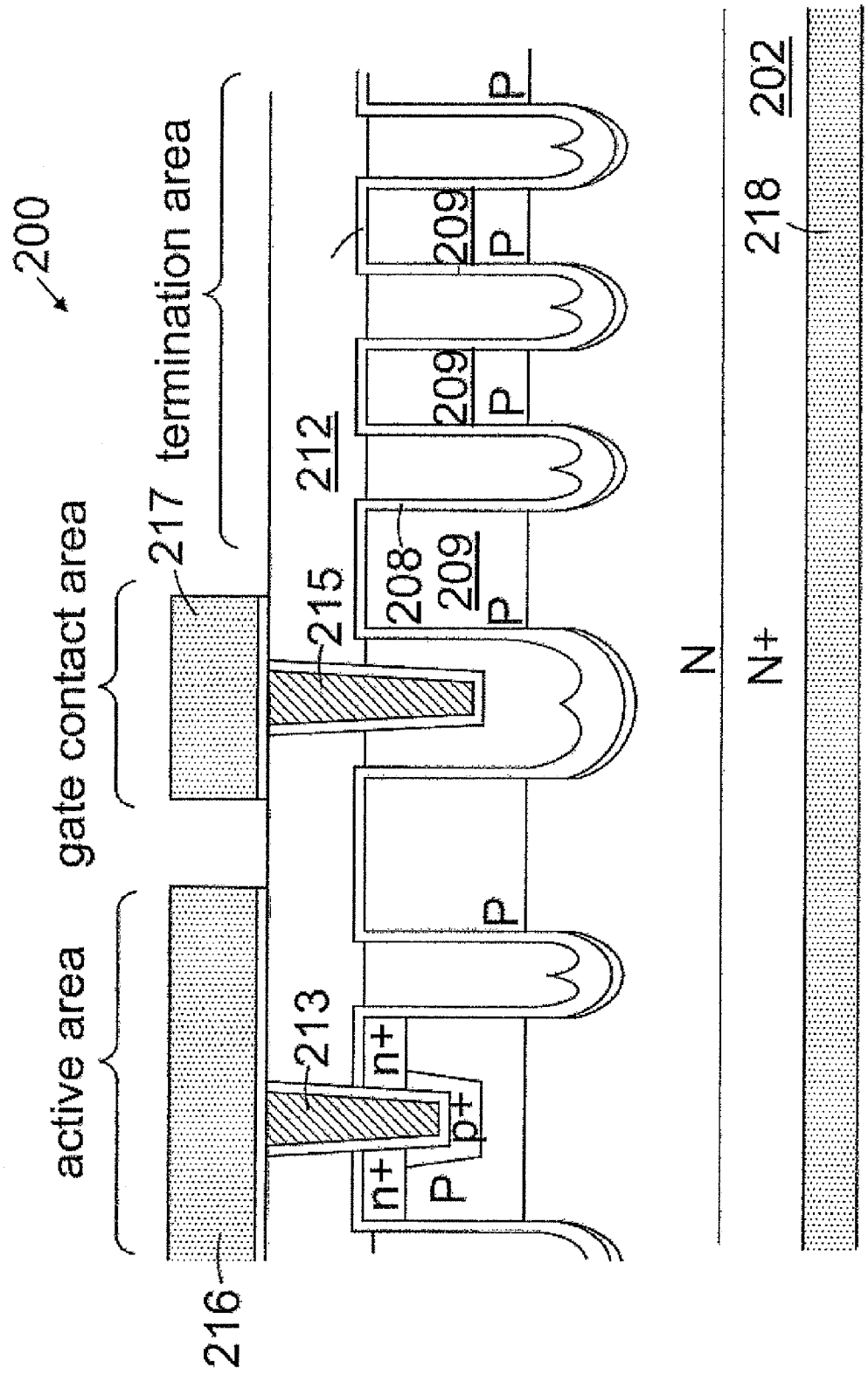

In FIG. 5I, a barrier layer of Ti/TIN or Co/TiN or Ta/TiN is deposited along inner surface of the source-body contact trench and the gate contact trench, then, a tungsten metal layer is deposited onto the barrier layer. After that, the tungsten metal layer and the barrier layer are successively etched back to be kept within the source-body contact opening and the gate contact opening to serve as tungsten metal plug 213 and 215 respectively for a trenched source-body contact 211 and a trenched gate contact 214. Next, onto the contact insulating layer 212, a Al alloys layer optionally padded by a resistance-reduction layer of Ti or T/TiN is deposited and then patterned into source metal 216 and gate metal 217 by using a metal mask. The source metal 216 is electrically contacting with the tungsten metal plug 213 and the gate metal 217 is electrically contacting with the tungsten metal plug 215. Then, after grinding the rear side of the N+ substrate 202, a back metal is deposited thereon to serve as drain electrode 218 for the trench MOSFET 200.

Figure 6B:
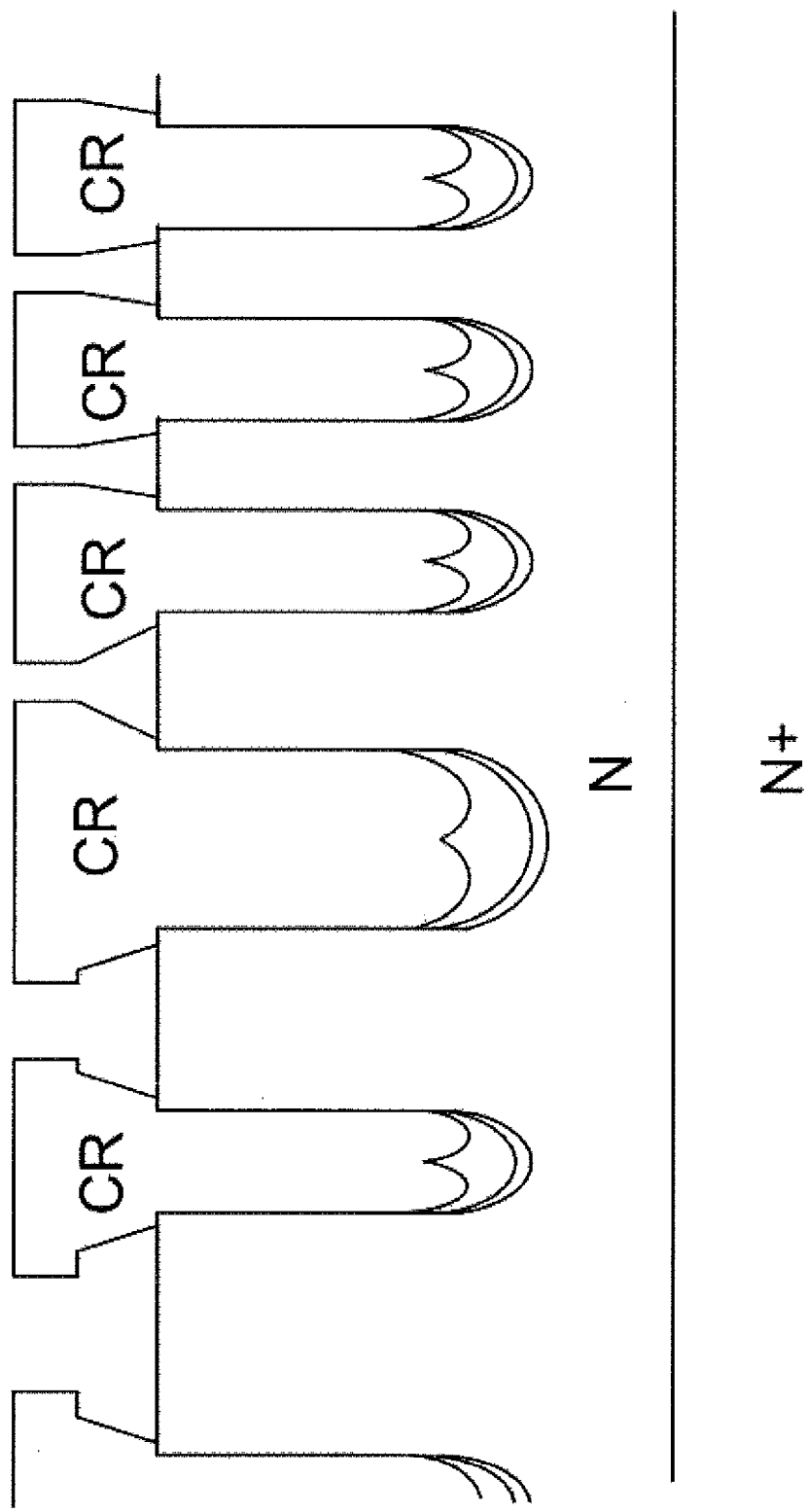

FIGS. 6A and 6B show some exemplary steps that show another method to remove the pad oxide and the HDP oxide on top surface of the mesa area while making the trench MOSFET 200 in FIG. 2A. In FIG. 6A, after removing the portion of the HDP oxide and the pad oxide along trench sidewalls of those gate trenches, a coat resist (CR, as illustrated in FIG. 6A) is applied filling into those gate trenches and covering top surface of the N epitaxial layer. Then, after applying a TBO (trench bottom oxide) mask (not shown) onto the coat resistance, a step of exposure and developing is carried out to open up portion of the HDP oxide on top surface of the mesa area.

In FIG. 6B, a wet oxide etching is carried out to remove away the portion of the HDP oxide from the top surface of the mesa area.

Figure 7A:
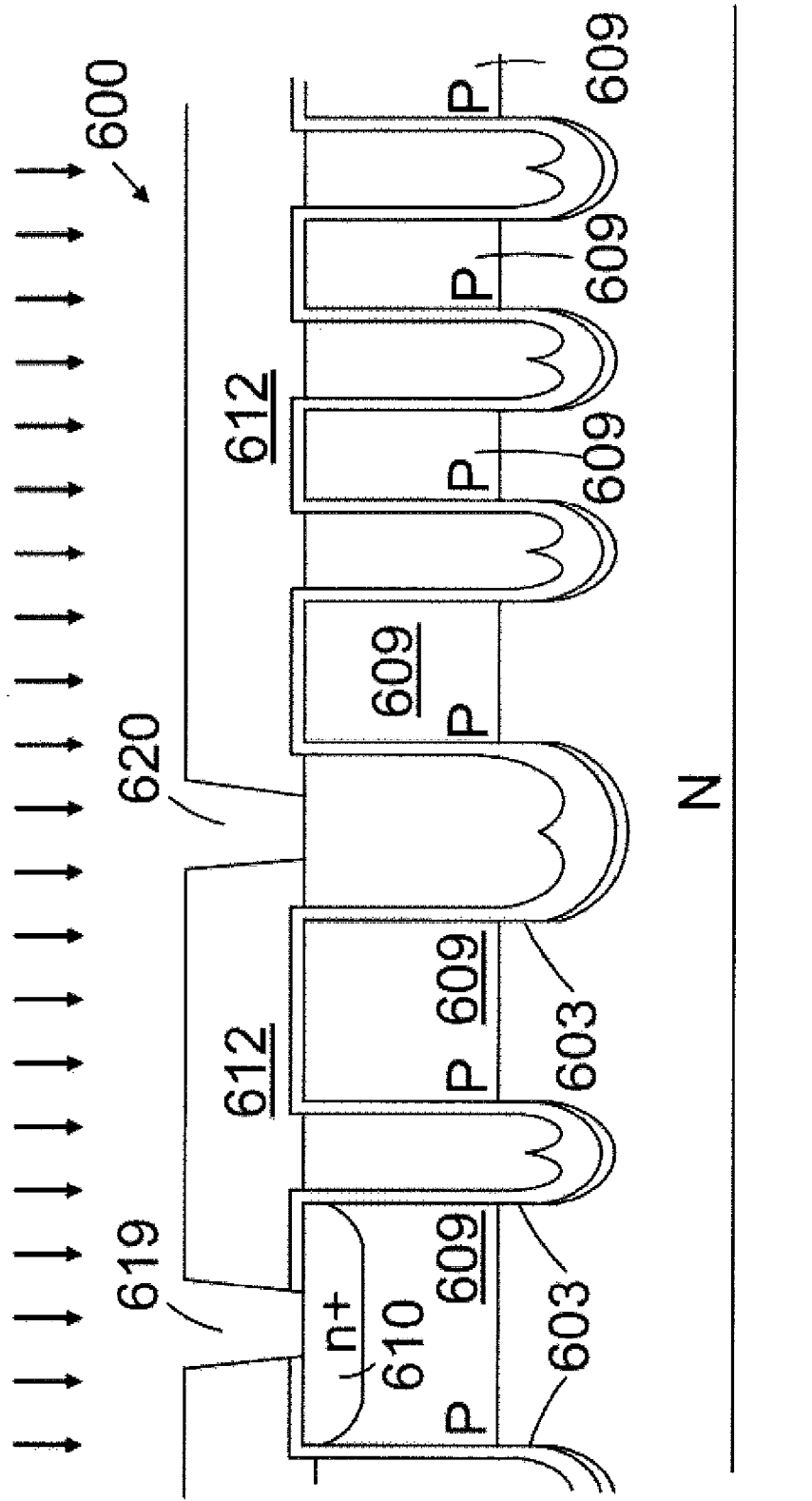
FIGS. 7A-7B are a serial of side cross-sectional views for showing the processing steps for fabricating the trench MOSFET as shown in FIG. 4.
Figure 7B:
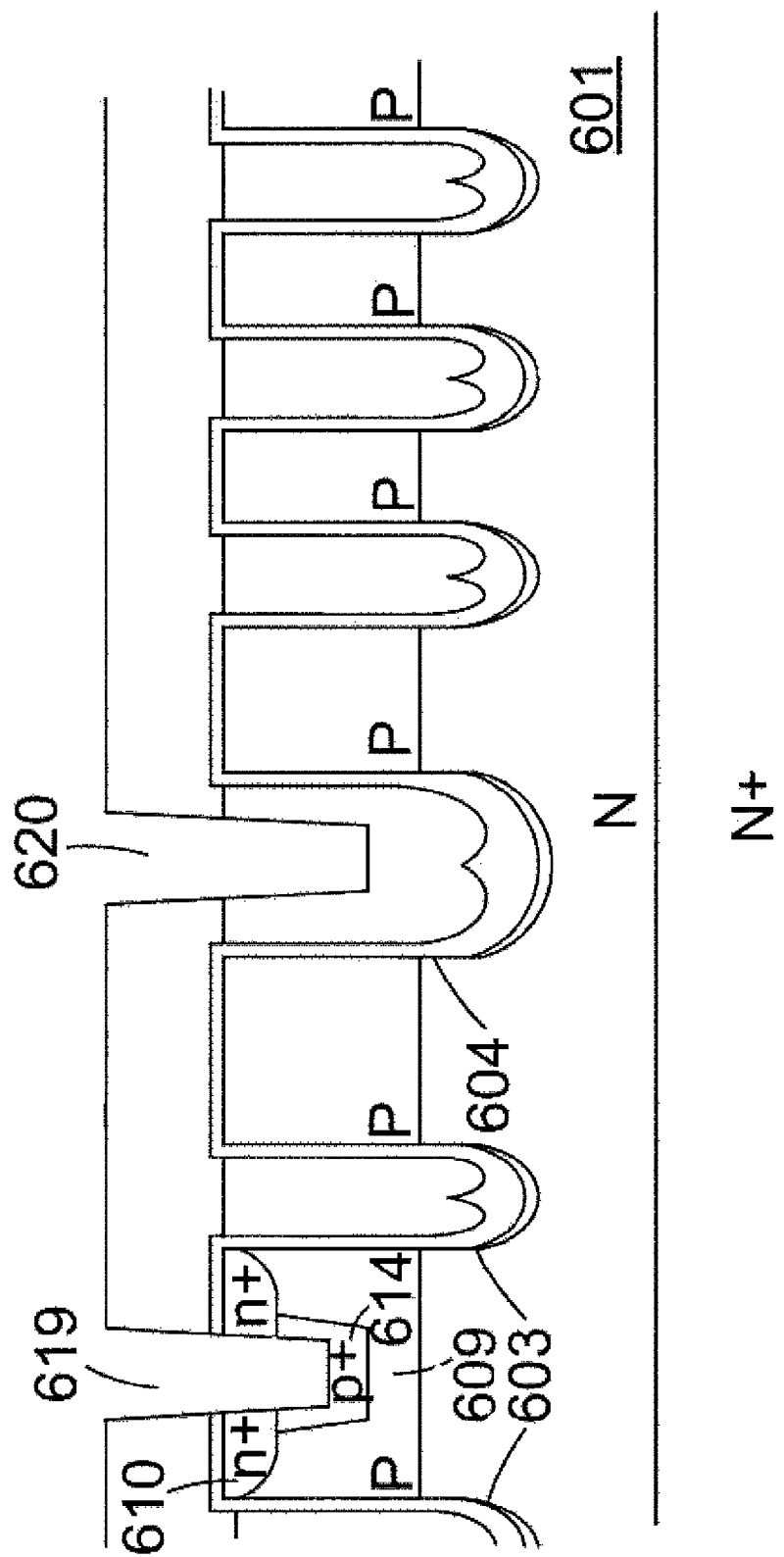

FIGS. 7A and 7B show some exemplary steps that are performed to form the preferred N-channel trench MOSFET 600 in FIG. 4 by using 3 masks. In FIG. 7A, after formation of the P body region 609, a contact insulating layer 612 is firstly formed covering the trench MOSFET 600, then, after applying a contact mask (not shown), the contact insulating layer 612 is etched by dry oxide etching to form a source-body contact opening 619 and a gate contact opening 620 as illustrated. Then, a source ion implantation and source diffusion steps are carried out successively without using a source mask to form n+ source region 610. In FIG. 7B, by performing a dry silicon etching step, the source-body contact opening 619 is etched to further penetrate through the n+ source region 610 and extend into the P body region 609, the gate contact opening 620 is etched to further extend into the second type trenched gate 604. As the n+ source region 610 is formed by the source diffusion step from center portion between two adjacent of the first type trenched gates 603 to channel region near sidewalls of the first type trenched gates 603, it has doping concentration along the channel region lower than along the source-body contact opening 619 at same distance from the top surface of the N epitaxial layer 601, and junction depth of the n+ source region 610 is shallower along the channel region than along the source-body contact opening 619, and the doping profile of the n+ source region 610 along the top surface of the N epitaxial layer 601 has Gaussian-distribution from the source-body contact opening 619 to the channel region. Then, a p+ ion implantation is carried out to form the p+ ohmic body contact region 614 wrapping around bottom and sidewalls of the source-body contact opening 619 in the P body region 609.

FIG. 8 shows an exemplary step for formation of the n* on-resistance reduction doped region 518 while fabricating the preferred N-channel trench MOSFET 500 in FIG. 3B.

After the formation of the pad oxide 507, an n type dopant ion implantation is carried out to form the n* on-resistance reduction doped region 518 surrounding bottom of all the gate trenches formed in the N epitaxial layer 501.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A method of manufacturing a semiconductor power device comprising:
    (a) forming a plurality of trenches in an epitaxial layer of first conductivity type;
    (b) depositing a HDP oxide on trench sidewall, and bottom, and top surface of said mesa area wherein said trench sidewall has thinner oxide than said trench bottom and said mesa area;
    (d) removing, using wet etching, the oxide on trench sidewall completely, and the oxide on trench bottom and said mesa area partially wherein a remaining oxide and said pad oxide on trench bottom defined as bottom oxide layer;
    (e) depositing a photo resist filled into said trenches and top surface of said mesa area;
    (f) removing a portion of said photo resist from top surface of said mesa area to expose said portion of surface area of said oxide on said mesa area where said oxide layer can be removed;
    (g) removing said oxide on said top surface of said mesa area completely;
    (h) forming a gate oxide on trench sidewall; and
    (i) forming trenched gates, trenched floating gates, body regions, source regions and trenched source-body contact in said epitaxial layer.

2. The method according to claim 1, wherein the step (b) further comprises forming a pad layer on trench sidewall and bottom, and top surface of a mesa area between adjacent trenches before depositing said HDP oxide.

3. The method according to claim 1, wherein the step (f) is performed by blankly exposing said photo resist without having an additional mask.

4. The method according to claim 1, wherein the step (f) is performed by blankly dry ashing said photo resist without having an additional mask.

5. The method according to claim 1, wherein the step (f) is performed by exposing photo resist with an additional over-sized mask protecting said photo resist on top of said trenches.

6. The method according to claim 1, wherein the step (i) further comprises:
    applying a contact mask and dry oxide etching to remove an insulation layer overlying said semiconductor device from contact open areas;
    implanting a dopant of said first conductivity type through said contact open areas and diffusing it to form said source regions; and then forming trenched source-body contact into body region by dry silicon etch through said source regions.

* * * * *